United States Patent
Onda

[11] Patent Number: 5,770,489
[45] Date of Patent: Jun. 23, 1998

[54] METHOD OF MAKING A COMPOUND SEMICONDUCTOR FIELD-EFFECT TRANSISTOR

[75] Inventor: Kazuhiko Onda, Tokyo, Japan

[73] Assignee: NEC Corporation, Tokyo, Japan

[21] Appl. No.: 444,026

[22] Filed: May 18, 1995

[30] Foreign Application Priority Data

May 18, 1994 [JP] Japan .................................. 6-103654

[51] Int. Cl.⁶ .................................................. H01L 21/338
[52] U.S. Cl. ............................ 438/167; 438/172; 438/180; 438/604; 438/605
[58] Field of Search .................. 437/40 SH, 41 SH, 437/40 LC, 41 LC, 133, 912; 438/167, 172, 180, 173, 604, 605, 606

[56] References Cited

U.S. PATENT DOCUMENTS

| | | | |
|---|---|---|---|
| 4,728,621 | 3/1988 | Graf et al. | 437/41 SH |
| 4,784,718 | 11/1988 | Mitani et al. | 437/41 SH |
| 4,792,531 | 12/1988 | Kakihana | 437/41 SH |
| 4,961,194 | 10/1990 | Kuroda et al. | 357/22 |
| 4,962,054 | 10/1990 | Shikata | 437/41 SH |
| 5,300,795 | 4/1994 | Saunier et al. | 437/133 |
| 5,322,808 | 6/1994 | Brown et al. | 437/133 |
| 5,358,878 | 10/1994 | Suchet et al. | 437/912 |
| 5,364,816 | 11/1994 | Boos et al. | 437/133 |
| 5,369,043 | 11/1994 | Hyuga et al. | 437/41 SH |
| 5,489,539 | 2/1996 | Kubena | 437/912 |

FOREIGN PATENT DOCUMENTS 5-121448  5/1993  Japan .

OTHER PUBLICATIONS

De Salvo et al., "Simplified Ohmie and Schottky Contact Formation for Field Effect Transistors Using the Single Layer Integrated Metal Field Effect Transistor (SLIMFET) Process", IEEE Transactions on Semiconductor Manufacturing, vol. 8, No. 3, Aug. 1995, pp. 314–318.

Havasy et al., "A Highly Manufacturable 0.2 mm AlGaAs/InGaAs PHEMT Fabricated Using the Single-Layer Integrated-Metal FET (SLIMFET) Process", IEEE Gallium Arsenide Integrated Circuit Symposium, Conference Proceedings, San Diego, CA, Oct. 1995, 4 pgs.

Kuroda et al., "A New Fabrication Technology for AlGaAs/GaAs HEMT LSI's Using InGaAs Nonalloyed Ohmic Contacts", IEEE Transactions on Electron Devices, vol. 36, No. 10, Oct. 1989, pp. 2196–2203.

Woodall et al., "Ohmic Contacts to n–GaAs Using Graded Band Gap Layers of $Ga_{1-x}In_xAs$ Grown by Molecular Beam Epitaxy", J. Vac. Sci. Technol., 19(3), Sep./Oct. 1981, pp. 626–627.

(List continued on next page.)

Primary Examiner—Charles L. Bowers, Jr.
Assistant Examiner—Lynne A. Gurley
Attorney, Agent, or Firm—Sughrue, Mion, Zinn, Macpeak & Seas, PLLC

[57] ABSTRACT

A fabrication method of a compound semiconductor FET that enables to produce source/drain electrodes and a gate electrode at any positions flexibly without increase of the number of necessary process steps. First, a compound semiconductor substructure having on its surface first regions on which source/drain electrodes are formed respectively and a second region on which a gate electrode is formed is prepared. A patterned mask film is then formed on the surface of the substructure. The mask film has first windows for the source/drain electrodes and a second window for the gate electrode. A conductor film is selectively formed on the surface of the substructure using the patterned mask film as a mask. The conductor film contains first parts placed on the first regions through the respective first windows of the mask film and second part placed on the second region through the second window of the mask film. The first parts of the conductor film are in ohmic contact with the surface of the substructure to act as the source/drain electrodes, respectively. The second part of the conductor film is in Schottky contact with the surface of the substructure to act as the gate electrode.

6 Claims, 5 Drawing Sheets

OTHER PUBLICATIONS

Kuroda et al., "HEMT with Nonalloyed Ohmic Contacts Using n$^+$–InGaAs Cap Layer", IEEE Electron Device Letters, EDL–8, No. 9, Sep. 1987, pp. 389–391.

N. Braslau et al., "Metal–Semiconductor Contacts for GaAs Bulk Effect Devices", *Solid–State Electronics*, Pergamon Press 1967, vol. 10, pp. 381–383.

Takumi Nittono et al., "Non–Alloyed Ohmic Contacts to n–GaAs Using Compositionally Graded In$_x$Ga$_{1-x}$As Layers", *Japanese Journal of Applied Physics*, vol. 27, No. 9, Sep., 1988, pp. 1718–1722.

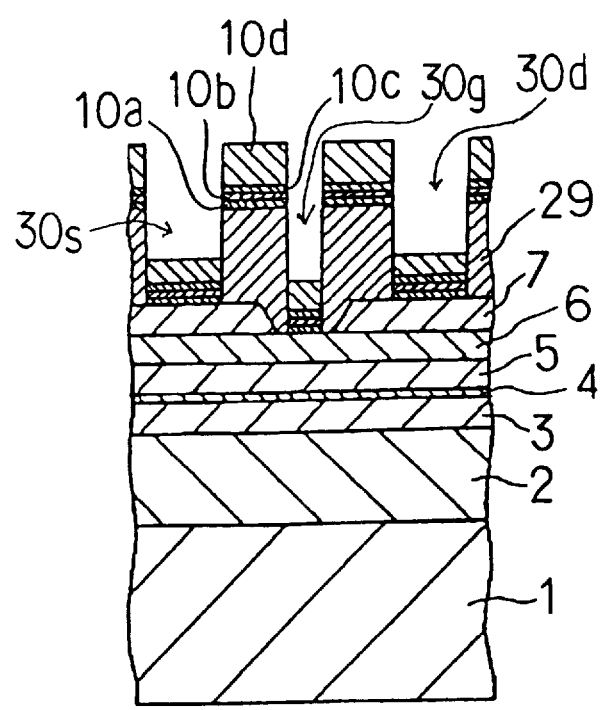

METHOD OF MAKING A COMPOUND SEMICONDUCTOR FIELD-EFFECT TRANSISTOR

BACKGROUND OF THE INVENTION

1. Field of the Invention

The present invention relates to a fabrication method of a field-effect transistor (FET) and more particularly, to a fabrication method of a compound semiconductor FET capable of high-speed operation at microwave or millimetric wave frequencies.

2. Description of the Prior Art

Braslau et al. reported in 1967 that a superior ohmic contact to n-GaAs could be realized by evaporating an alloy of Au, Ge and Ni on n-GaAs and heat-treating or annealing the alloy at a temperature equal to or higher than the eutectic temperature of the alloy in Solid-State Electronics, Vol. 10, pp381–383, 1967.

Since this report, the above Au/Ge/Ni alloy has been widely used as a suitable material for an ohmic electrode to n-GaAs or the like in compound semiconductor devices such as FETs and bipolar transistors.

On the other hand, a lot of non-alloyed ohmic electrodes have been developed and reported, one of which is disclosed in Japanese Journal of Applied Physics, vol. 27, No 9, September, 1988, pp1718–1722 by Nittono et al.. With the ohmic electrode of Nittono et al., InGaAs having a low Schottky barrier height was employed as a semiconductor material contacted with the electrode. As an electrode material, a refractory metal such as WSi was employed. The InGaAs was heavily doped with impurity, so that electrons supplied from the electrode to the InGaAs material due to thermoionic emission and tunneling effect flowed readily into the channel of the FET.

The ohmic electrode of the Nittono et al. provided the following advantages.

First, the Au/Ge/Ni alloy is not essentially employed as an ohmic electrode material to GaAs and therefore, an ohmic electrode can be made of one of comparatively stable electrode materials such as Ti/Pt/Au, W and WSi. This means that the electrode can be made of more than one material selected from that comparatively stable electrode materials.

Second, since no alloying process at a high temperature is necessary, the ohmic electrode is prevented from sagging or flagging due to applied heat during the alloying process. Accordingly, there is no possibility that the electrode is shaped other than that of the given shape.

Third, since no alloying process at a high temperature is necessary, even if the process of forming a gate electrode is performed prior to the process of forming ohmic electrodes i.e., source/drain electrodes, no deterioration of the gate electrode occurs during the process of forming the ohmic electrodes.

Although the above two reports were related to GaAs, the conventional ohmic electrodes proposed by the reports have been used for other materials such as InGaAs and InP.

With regard to the gate electrode of the FET, in which the Schtokky contact to a semiconductor material is necessary, conventionally, Ti/Pt/Au, Ti/Au, W or the like have been used typically. The conventional gate electrode has been generally made by a combination of electrode material evaporation and lift-off processes, a sputtering process, or the like.

In fabrication of the compound semiconductor FET, both processes of forming the ohmic contact or source/drain electrodes and forming the Schottky contact or gate electrode are essential. When the conventional ohmic electrodes and Schtokky electrode described above are employed, popularly, each of the processes needs to be performed separately. Also, the ohmic electrodes require the alloying process. As a result, the number of necessary process steps increases.

To solve this problem, a fabrication method of the compound semiconductor FET was developed, in which the ohmic contact electrodes and the Schottky contact electrode are formed in the same process step. This method is disclosed in the Japanese Non-Examined Patent Publication No. 5-121448 (May, 1993).

This conventional method contains the following steps:

A compound semiconductor layered structure having an InGaAs layer at the top of the structure is prepared. A first insulator film is formed on the InGaAs layer, and a second insulator film is formed on the first insulator film.

Next, a patterned photoresist film having a gate window is formed on the second insulator film. Using the patterned photoresist film as a mask, the first and second insulator films are etched selectively. At this time, the upper second insulator film has a wider undercut than that of the lower first insulator film with regard to the mask. The patterned photoresist film is then removed.

Subsequently, using the etched first insulator film as a mask, the layered structure containing the InGaAs layer is etched selectively to form a recess at a corresponding position to the gate window on the exposed area of the structure.

A third insulator film is formed on the etched second insulator film to be contacted with the side walls of the first and second insulator films and the exposed area of the structure. The third insulator film is then etched selectively so that the remaining third insulator film is positioned at each side of the recess, producing a pair of spacers. Each of the pair of spacers covers side walls of the first and second insulator films and the side wall of the recess. The bottom of the recess is exposed from the pair of spacers therebetween. The top portions of the pair of spacers extend laterally outside of the recess since the upper second insulator film has the wider undercut than that of the lower first insulator film.

After the first and second insulator films are removed, a metal film is selectively formed by evaporation on the InGaAs layer using the pair of spacers as a mask. The parts of the metal film formed on the InGaAs layer act as source/drain electrodes. The part of the metal film formed on the pair of spacers, which is contacted with the bottom of the recess between the pair of spacers, acts as a gate electrode.

Thus, the source/drain ohmic electrodes and the gate Schottky electrode are produced in self-alignment to the pair of spacers, simultaneously.

With the conventional fabrication method of the Japanese Non-Examined Patent Publication No. 5-121448, the number of necessary process steps can be reduced. However, the source/drain electrodes and the gate electrode are formed in self-alignment to the pair of spacers, and therefore, a problem occurs that the positions of the source/drain and gate electrodes cannot be flexibly set.

SUMMARY OF THE INVENTION

Accordingly, an object of the present invention is to provide a fabrication method of a compound semiconductor FET in which source/drain electrodes and a gate electrode of the FET can be formed at any positions flexibly without increase of the number of necessary process steps.

Another object of the present invention is to provide a fabrication method of a compound semiconductor FET in which highly reliable source/drain electrodes and a gate electrode of the FET can be formed.

A fabrication method of a compound semiconductor FET according to the present invention contains the following steps:

A compound semiconductor substructure is prepared. A surface of the substructure has first regions on which source/drain electrodes are formed and a second region on which a gate electrode is formed.

Next, a patterned mask film is formed on the surface of the substructure to cover the first regions and the second region. The mask film has first windows for the source/drain electrodes and a second window for the gate electrode.

A conductor film is selectively formed on the surface of the substructure using the patterned mask film as a mask. The conductor film contains first parts placed on the first regions through the respective first windows of the mask film and a second part placed on the second region through the second window of the mask film.

The first parts of the conductor film are in ohmic contact with the surface of the substructure to act as the source/drain electrodes of the FET. The second part of the conductor film is in Schottky contact with the surface of the substructure to act as the gate electrode of the FET.

The compound semiconductor substructure may be made of any compound semiconductor material if the first parts of the conductor film are in ohmic contact with the surface of the substructure and the second part thereof is in Schottky contact with the surface of the substructure.

The compound semiconductor substructure is typically made of a compound semiconductor substrate and at least one compound semiconductor layer formed on the substrate. In this case, the patterned mask film is formed on the surface of the at least one compound semiconductor layer, which is preferably InGaAs.

Since InGaAs has a narrow energy band gap, the contact between the first parts of the conductor film and the surface of the substructure can be ohmic without an alloying process.

Preferably, the conductor film has a multilayer structure made of stacked conductor layers and the lowest one of the conductor layers in the stack is made of molybdenum (Mo). In this case, because Mo is difficult to react with compound semiconductor materials such as In or GaAs, higher reliability can be obtained.

The substructure preferably has a recess formed on the second region of the surface of the substructure. In this case, the second part of the conductor film acting as the gate electrode is placed in the recess. However, the substructure may not have such a recess.

With the fabrication method of a compound semiconductor FET according to the invention, the surface of the compound semiconductor substructure has the first regions for source/drain electrodes and the second region for the gate electrode. The conductor film is selectively formed on the surface of the substructure using the patterned mask film having the first windows and the second window, so that the source/drain electrodes are formed by the first parts of the conductor film placed on the first regions and the gate electrode is formed by the second parts of the conductor film placed on the second region.

Therefore, the positions of the source/drain electrodes and that of the gate electrode are determined by the first and second windows of the mask film.

Also, the source/drain electrodes and the gate electrode are made of the same conductor film simultaneously.

As a result, the source/drain electrodes and the gate electrode can be formed at any positions flexibly without increase of the number of fabrication process steps.

Further, if Mo is employed as the material of the lowest layer of the stacked conductor layers of the conductor film, higher reliability can be obtained because Mo is difficult to react with compound semiconductor materials

BRIEF DESCRIPTION OF THE DRAWINGS

FIGS. 3A to 3D are schematic cross-sectional views for showing process steps of the fabrication method according to the first embodiment of the invention, respectively.

DESCRIPTION OF THE PREFERRED EMBODIMENTS

First Embodiment

Figure 1:
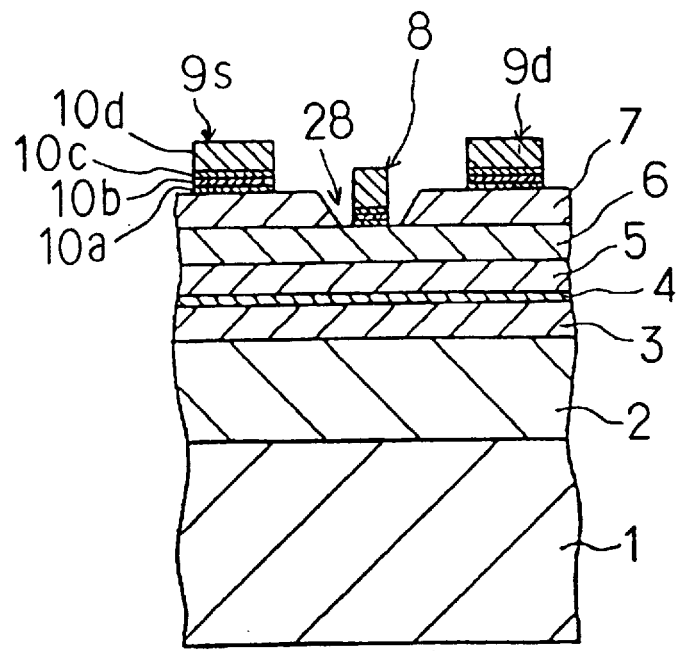
FIG. 1 is a schematic cross-sectional view of a compound semiconductor FET fabricated by a method according to a first embodiment of the invention.

FIG. 1 shows a compound semiconductor FET fabricated by a method according to a first embodiment of the invention.

In FIG. 1, an undoped InAlAs buffer layer 2 is formed on a surface of a semi-insulating InP substrate 1. An undoped InGaAs channel layer 3 is formed on the buffer layer 2. An undoped InAlAs spacer layer 4 is formed on the channel layer 3. An n-InAlAs donor layer 5 is formed on the spacer layer 4. An undoped InAlAs Schottky layer 6 is formed on the donor layer 5. An n-InGaAs cap layer 7 is formed on the Schottky layer 6. The cap layer 7 is selectively removed to expose the underlying Schottky layer 6, resulting in a recess 28 exposing the Schottky layer 6.

A gate electrode 8 is formed on the Schottky layer 6 in the recess 28. The gate electrode 8 has a multilayer structure made of a molybdenum (Mo) layer (thickness: 50 nm) 10a, a titanium (Ti) layer (thickness: 50 nm) 10b, a platinum (Pt) layer (thickness: 50 nm) 10c, and a gold (Au) layer (thickness: 300 nm) 10d. Since the Mo layer 10a at the bottom is directly contacted with the i-InAlAS layer 6, a Schottky contact is obtained therebetween.

A source electrode 9s and a drain electrode 9d are formed on the n-InGaAs cap layer 7 at each side of the gate electrode 8. Each of the source electrode 9s and the drain electrode 9d has the same multilayer structure as that of the gate electrode 8. Since the Mo layer 10a at the bottom of the structure is directly contacted with the n-InGaAS layer 7, an ohmic contact is obtained for each electrode 9s or 9d.

Figure 3A:
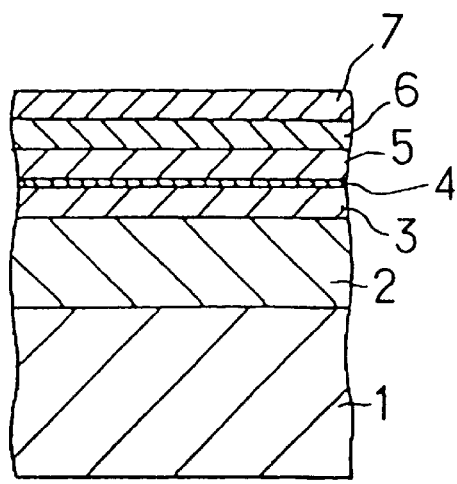

The FET having the above-described structure is fabricated through the following process steps:

First, as shown in FIG. 3A, the i-InAlAs buffer layer 2 with a thickness of 500 nm is grown on the surface of the semi-insulating InP substrate 1. The i-InGaAs channel layer 3 with a thickness of 40 nm is grown on the buffer layer 2. The i-InAlAs spacer layer 4 with a thickness of 3 nm is grown on the channel layer 3. The Si-doped n-InAlAs donor layer 5 with a thickness of 10 nm, the doping concentration of which is $5 \times 10^{18}$ atoms/cm$^3$, is grown on the spacer layer 4. The i-InAlAs Schottky layer 6 with a thickness of 20 nm is formed on the donor layer 5. The Si-doped n-InGaAs cap layer 7 with a thickness of 40 nm, the doping concentration of which is $3 \times 10^{18}$ atoms/cm$^3$, is grown on the Schottky layer 6.

As the doping concentration of the n-InGaAs cap layer 7 increases, the tunneling probability of the electrons supplied from the electrode 9s or 9d increases so that the contact resistance therebetween decreases.

The above processes are performed by any crystal growth method such as a molecular beam epitaxy (MBE).

Subsequently, an etching process for isolating individual devices or elements is performed at given positions on the substrate 1, which is not shown. In this process, a mixture of phosphoric acid, hydrogen peroxide and water may be used as an etchant.

Figure 3B:
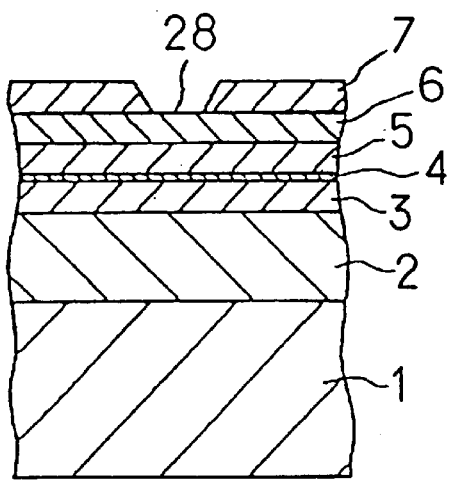

Next, as shown in FIG. 3B, the cap layer 7 is selectively etched to expose the underlying Schottky layer 6 by popular lithography and etching processes. Thus, the recess 28 is formed on the Schottky layer 6 at the corresponding position to the gate electrode 8. In this process, the same mixture as used in the above isolation etching process may be used as an etchant.

Figure 3C:
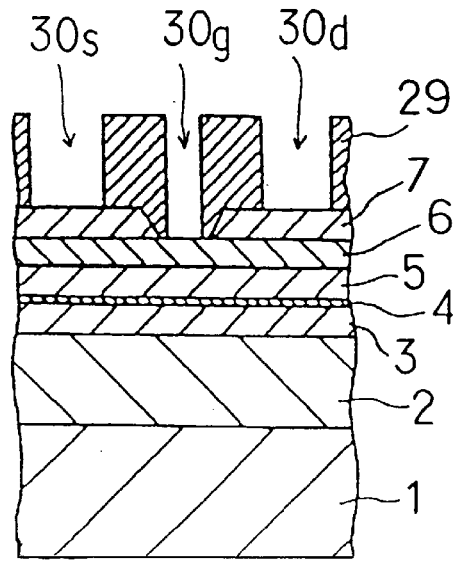

A resist film 29 is then formed on the cap layer 7 to cover the recess 28. The resist film 29 is patterned to have windows 30g, 30s and 30d, as shown in FIG. 3C. The window 30g for the gate electrode 8 is positioned on the recess 28. The window 30s for the source electrode 9s and the window 30d for the drain electrode 9d are positioned on the cap layer 7 at each side of the window 30g.

The process of forming such the patterned mask is performed by any lithography technique such as an optical lithography.

The Mo layer 10a with a thickness of 50 nm, Ti layer 10b with a thickness of 50 nm, Pt layer 10c with a thickness of 50 nm, and Au layer 10d with a thickness of 300 nm are formed successively on the patterned resist film 29 by an evaporation method. As shown In FIG. 3D, these four layers 10a, 10b, 10d and 10d are placed not only on the resist film 29 but also on the i-InAlAs Schottky layer 6 in the window 30g and the n-InGaAs cap layer 7 in the windows 30s and 30d.

The stacked metal layers 10a, 10b, 10c and 10d are then removed together with the resist film 29 to be left only in the windows 30g, 30s and 30d by a lift-off method. The stacked metal layers 10a, 10b, 10c and 10d left in the window 30g form the gate electrode 9. The stacked metal layers 10a, 10b, 10c and 10d left in the windows 30s and 30d form the source electrode 10s and the drain electrode 10d.

InGaAs has a satisfactorily narrow energy band gap and therefore, ohmic contacts can be made between the n-InGaAs cap layer 7 and the source and drain electrodes 9s and 9d without an alloying process.

A Schottky contact is made between the i-InAlAs Schottky layer 6 and the gate electrode 8.

Thus, the heterojunction FET as shown in FIG. 1 is obtained on the InP substrate 1.

With the FET fabricated by the method according the first embodiment, since the resist film 29 having the windows 30g, 30s and 30d are formed on the cap layer 7 and the stacked metal layers 10a, 10b, 10c and 10d are formed on the resist film 29, the gate electrode 8 and the source and drain electrodes 9s and 9d are produced in the same process, simultaneously.

Therefore, the positions of the source and drain electrodes 9s and 9d and that of the gate electrode 8 are determined by the windows 30s, 30d and 30g of the resist film 29.

As a result, the source and drain electrodes 9s and 9d and the gate electrode 8 can be formed at any positions flexibly without increase of the number of fabrication process steps.

Further, since the Mo layer 10a is placed at the bottom of the stacked metal layers, higher reliability can be obtained. This is because Mo is difficult to react with contacting compound semiconductor materials, i.e., InAlAS and InGaAs.

The above FET was practically fabricated by the method according to the first embodiment and some tests were conducted to confirm the effects or advantages of this invention. The test result stated that an obtainable mutual transconductance of the FET was 500 S/mm, and an obtainable cut-off frequency thereof was 35 GHz from its current gain characteristic.

Second Embodiment

Figure 2:
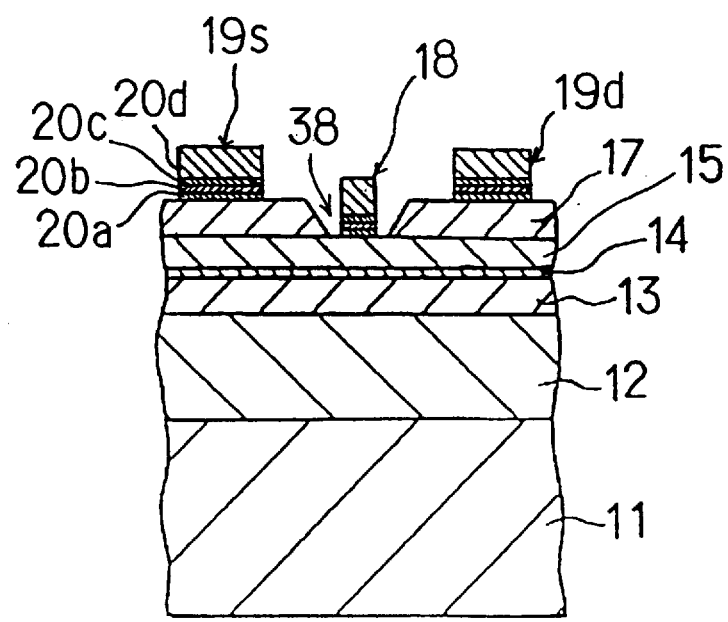
FIG. 2 is a schematic cross-sectional view of a compound semiconductor FET fabricated by a method according to a second embodiment of the invention.

FIG. 2 shows a compound semiconductor FET fabricated by a method according to a second embodiment of the invention.

In FIG. 2, an undoped GaAs buffer layer 12 is formed on a surface of a semi-insulating GaAs substrate 11. An undoped InGaAs channel layer 13 is formed on the buffer layer 12. An undoped AlGaAs spacer layer 14 is formed on the channel layer 13. An n-AlGaAs donor layer 15 is formed on the spacer layer 14. An n-InGaAs cap layer 17 is formed on the donor layer 15.

Different from the first embodiment, no Schottky layer is formed in this embodiment. The In composition of the cap layer 17 is graded from 0 to 0.5 in the direction along the thickness of the layer 17 in order to reduce its crystal strain. The In composition is zero (0) at the bottom face of the layer 17 and 0.5 at the top face thereof.

Any other gradient (e.g., from 0 to 1.0) of the In composition may be taken.

The cap layer 17 is selectively removed to expose the underlying donor layer 15, resulting in a recess 38 on the donor layer 15.

A gate electrode 18 is formed on the donor layer 15 in the recess 38. The gate electrode 38 has a multilayer structure made of a Mo layer (thickness: 50 nm) 20a, a Ti layer (thickness: 50 nm) 20b, a Pt layer (thickness: 50 nm) 20c, and a Au layer (thickness: 300 nm) 20d, which is the same as that of the first embodiment. Since the Mo layer 20a at the bottom is directly contacted with the n-AlGaAs donor layer 15, a Schottky contact is obtained therebetween.

A source electrode 19s and a drain electrode 19d are formed on the n-InGaAs cap layer 17 at each side of the gate electrode 18. Each of the source electrode 19s and the drain electrode 19d has the same multilayer structure as that of the gate electrode 18. Since the Mo layer 20a at the bottom is directly contacted with the n-InGaAS cap layer 17, an ohmic contact is obtained for each electrode 19s or 19d.

Figure 4A:
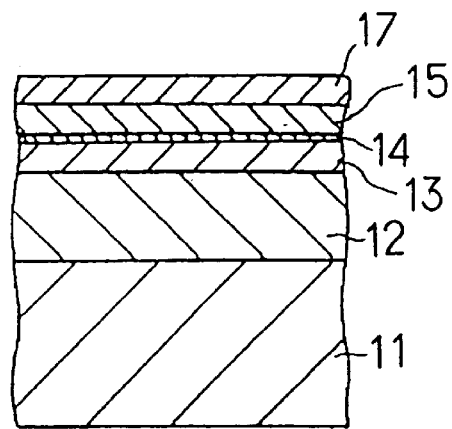
FIGS. 4A to 4D are schematic cross-sectional views for showing process steps of the fabrication method according to the second embodiment of the invention, respectively.

The FET having the above-described structure is fabricated through the following process steps:

First, as shown in FIG. 4A, the i-InGaAs buffer layer 12 with a thickness of 500 nm is grown on the surface of the semi-insulating GaAs substrate 11. The i-InGaAs channel layer 13 with a thickness of 40 nm is grown on the buffer layer 12. The i-AlGaAs spacer layer 14 with a thickness of 3 nm is grown on the channel layer 13. The Si-doped n-AlGaAs donor layer 15 with a thickness of 10 nm, the doping concentration of which is $5 \times 10^{18}$ atoms/cm$^3$, is grown on the spacer layer 14. The Si-doped n-InGaAs cap layer 17 with a thickness of 40 nm, the doping concentration of which is $3 \times 10^{18}$ atoms/cm$^3$, is grown on the donor layer 15.

Similar to the first embodiment, as the maximum doping concentration of the n-InGaAs cap layer 17 increases, the tunneling probability of the electrons supplied from the electrode 19s or 19d increases so that the contact resistance therebetween decreases.

The above processes are performed by any crystal growth method such as a molecular beam epitaxy (MBE).

Subsequently, an etching process for isolating individual devices or elements is performed at given positions on the substrate 11, which is not shown. In this process, the same etchant as in the first embodiment may be used.

Figure 4B:
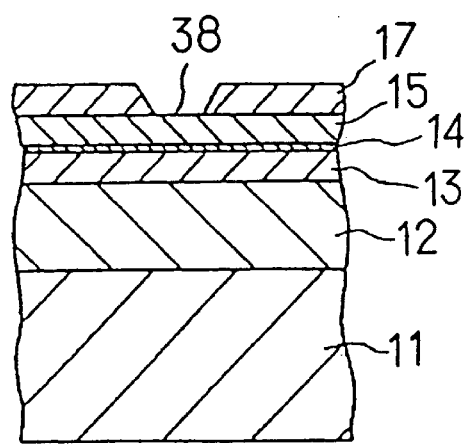

Next, as shown in FIG. 4B, the cap layer 17 is selectively etched to expose the underlying donor layer 15. Thus, the recess 38 is formed in the donor layer 15 at the corresponding position to the gate electrode 18. In this process, the same mixture as used in the above isolation etching process may be used as an etchant.

Figure 4C:
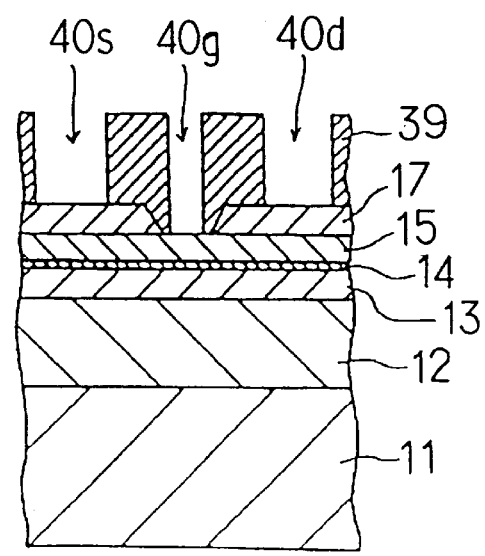

A resist film 39 is then formed on the cap layer 17 to cover the recess 38. The resist film 39 is patterned to have windows 40g, 40s and 40d, as shown in FIG. 4C. The window 40g for the gate electrode 18 is positioned in the recess 38. The window 40s for the source electrode 19s and the window 40d for the drain electrode 19d are positioned on the cap layer 17 at each side of the window 40g.

The process of forming such the patterned mask is performed by any lithography technique.

Figure 4D:
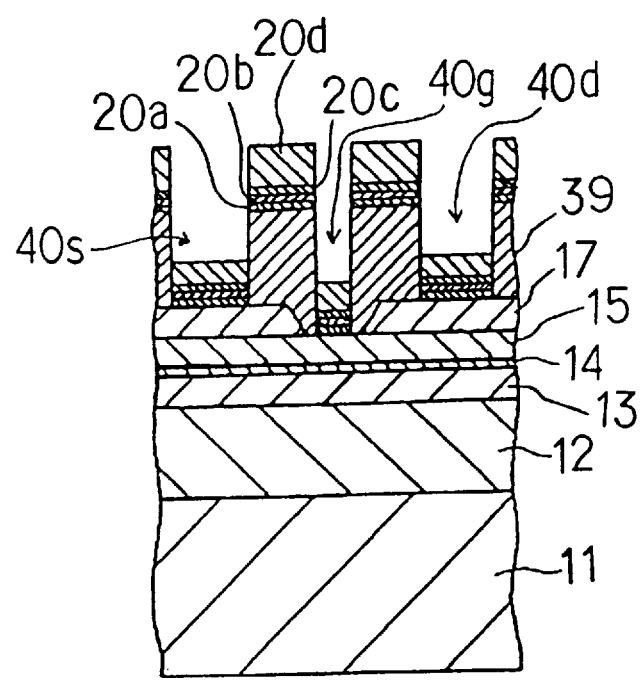

The Mo layer 20a with a thickness of 50 nm, Ti layer 20b with a thickness of 50 nm, Pt layer 20c with a thickness of 50 nm, and Au layer 20d with a thickness of 300 nm are formed successively on the patterned resist film 39 by an evaporation method. As shown in FIG. 4D, these four layers 20a, 20b, 20d and 20d are placed not only on the resist film 39 but also on the n-AlGaAs donor layer 15 in the window 40g and then n-InGaAs cap layer 17 in the windows 40s and 40d.

The stacked metal layers 20a, 20b, 20c and 20d are then removed together with the resist film 39 to be left only in the windows 40g, 40s and 40d by a lift-off method. The stacked metal layers 20a, 20b, 20c and 20d left in the window 40g form the gate electrode 19. The stacked metal layers 20a, 20b, 20c and 20d left in the windows 40s and 40d form the source electrode 20s and the drain electrode 20d.

The n-InGaAs cap layer 7 is in ohmic contact with the source and drain electrodes 19s and 19d even if no alloying process is added.

The n-AlGaAs donor layer 15 is in Schottky contact with the gate electrode 18.

Thus, the heterojunction FET as shown in FIG. 2 is obtained on the GaAs substrate 11.

With the FET fabricated by the method according the second embodiment, the gate electrode 18 and the source and drain electrodes 19s and 19d are produced in the same process, simultaneously using the patterned resist film 39. Therefore, the positions of the source and drain electrodes 19s and 19d and that of the gate electrode 18 are determined by the windows 30s, 30d and 30g of the resist film 29.

As a result, the source and drain electrodes 19s and 19d and the gate electrode 18 can be formed at any positions flexibly without increase of the number of fabrication process steps.

Also, since the Mo layer 20a is placed at the bottom of the stacked metal layers, higher reliability can be obtained. This is because Mo is difficult to react with AlGaAS and InGaAs.

The above FET was practically fabricated by the method according to the second embodiment and the same tests were conducted. The test result stated that an obtainable mutual transconductance of the FET was 500 S/mm, and an obtainable cut-off frequency thereof was 35 GHz from its current gain characteristic.

In the above first and second embodiments, specific semiconductor or conductor materials are used. However, these materials were selected for the sake of ease of comprehension, and any other materials may be used. Also, it is needless to say that the values of doping concentration, thickness or the like and the stacked metal structures as shown in the both embodiments may be changed.

Although each electrode is made of the Mo/Ti/Pt/Au stacked metal layers in the embodiments, any other structure may be used, examples of which are as follows:
(a) three-layer structure:
  Mo/Ti/Al, Mo/Ti/Au, Au/Ge/Ni, Ti/Pt/Au,
(b) two-layer structure:
  Mo/Au, Ti/Al
(c) single-layer structure:
  Mo, W, WSi In the three- and two-layer example structures containing a Mo layer, the Mo layer is preferably placed at the bottom.

Although the source, drain and gate electrodes are formed by evaporation and lift-off processes in the embodiments, any other process such as sputtering may be employed.

Further, a recess is formed on the top of the semiconductor layered structure in the embodiments. However, the recess is not essential for the invention. It is sufficient for the invention that the source/drain electrodes are in ohmic contact with their corresponding semiconductor material and the gate electrode is in Schottky contact with its corresponding semiconductor material.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a compound semiconductor field-effect transistor, said method comprising the steps of:

preparing a compound semiconductor substructure, a surface of said substructure having first regions on which source/drain electrodes of said transistor are to be formed and a second region on which a gate electrode of said transistor is to be formed, said first and second regions having boundaries;

forming a patterned mask film on said surface of said substructure over said first regions and said second region, said patterned mask film having first windows for said source/drain electrodes and a second window for said gate electrode said first and second windows having boundaries, said boundaries of said first windows being set separately from said boundaries of said first regions and said boundary of said second window being set separately from said boundary of said second region; and selectively forming a conductor film on said surface of said substructure using said patterned mask film as a mask; said conductor film containing first parts placed on said first regions through said first windows of said mask film and a second part placed on said second region through said second window of said patterned mask film;

whereby said first parts of said conductor film are in electrical contact with said surface of said substructure to act as said source/drain electrodes and said second part of said conductor film is in electrical contact with said surface of said substructure to act as said gate electrode;

wherein said step of preparing a compound semiconductor substructure further comprises:
 forming an InAlAs layer over a compound semiconductor substrate made of InP;
 forming an InGaAs layer over said InAlAs layer, said InGaAs layer having an opening, said opening forming a recess exposing said InAlAs layer; and
 forming said patterned mask film on a surface of said substructure, said second window being positioned over said recess; and wherein, said second part of said conductor film is placed on said InAlAs layer in said recess and a lowest layer of the source/drain and gate electrodes is made of Mo, said lowest layer of said source/drain electrodes are in contact with said InGaAs layer and said lowest layer of said gate electrode is in contact with said InAlAs layer.

2. The method as claimed in claim 1, wherein said step of selectively forming said conductor film further comprises:
 selectively forming an Mo layer on said surface of said substructure.

3. The method as claimed in claim 2, wherein said step of selectively forming said conductor film further comprises:
 forming a Ti layer over said Mo layer;
 forming a Pt layer over said Mo layer; and
 forming a Au layer over said Mo layer.

4. A fabrication method of a compound semiconductor field-effect transistor, said method comprising the steps of:
 forming a compound semiconductor buffer layer on a compound semiconductor substrate made of InP;
 forming a compound semiconductor channel layer on said buffer layer;
 forming a compound semiconductor donor layer over said channel layer;
 forming a compound semiconductor Schottky layer on said donor layer, said compound semiconductor Schottky layer formed of InAlAs;
 forming a compound semiconductor cap layer on said Schottky layer, said cap layer formed of InGaAs;
 selectively removing said cap layer to expose said Schottky layer in a recess, thereby providing a surface which comprises a Schottky region and cap layer regions, said Schottky region and said cap layer regions having boundaries;
 forming a patterned mask film over said cap layer and said recess, said patterned mask film having first windows corresponding to said source/drain electrodes on said cap layer and a second window corresponding to said gate electrode on said Schottky layer, said first windows and said second window having boundaries, said boundaries of said first windows being set separately from said boundaries of said cap layer regions and said boundary of said second window being set separately from said boundary of said Schottky region; and
 selectively forming a conductor film on said cap layer and said Schottky layer and forming a contact region of Mo between said conductor film and said cap layer and said Schottky layer surface of said substructure using said patterned mask film as a mask, said conductor film containing first parts placed on said cap layer through said first windows of said patterned mask film and a second part placed on said Schottky layer through said second window of said mask film, said contact region of Mo directly contacting said cap layer and said Schottky layer surface;
 whereby said first parts of said conductor film are in electrical contact with said cap layer to act as said source/drain electrodes, and said second part of said conductor film is in electrical contact with said Schottky layer to act as said gate electrode.

5. The method as claimed in claim 4, wherein said step of selectively forming a conductor film further comprises:
 selectively forming a Mo layer on said cap layer and said Schottky layer.

6. The method as claimed in claim 5, wherein said step of selectively forming said conductor film further comprises:
 forming a Ti layer over said Mo layer;
 forming a Pt layer over said Mo layer; and
 forming a Au layer over said Mo layer.

* * * * *

UNITED STATES PATENT AND TRADEMARK OFFICE
CERTIFICATE OF CORRECTION

PATENT NO. : 5,770,489
DATED : June 23, 1998
INVENTOR(S) : Kazuhiko ONDA

It is certified that error(s) appears in the above-identified patent and that said Letters Patent is hereby corrected as shown below:

Col. 7, line 42, change "20d" (first occurrence) to --20c--.

Signed and Sealed this

Twenty-ninth Day of December, 1998

*Attest:*

BRUCE LEHMAN

*Attesting Officer*     *Commissioner of Patents and Trademarks*